United States Patent [19]

Tsang

[11] Patent Number: 4,663,685
[45] Date of Patent: May 5, 1987

[54] MAGNETORESISTIVE READ TRANSDUCER HAVING PATTERNED LONGITUDINAL BIAS

[75] Inventor: Ching H. Tsang, Sunnyvale, Calif.

[73] Assignee: International Business Machines, Armonk, N.Y.

[21] Appl. No.: 766,157

[22] Filed: Aug. 15, 1985

[51] Int. Cl.⁴ .............................................. G11B 5/30
[52] U.S. Cl. .................................................. 360/113
[58] Field of Search ........................................ 360/113

[56] References Cited

U.S. PATENT DOCUMENTS

| 3,864,751 | 6/1975 | Beaulieu et al. | 360/113 |
| 3,887,944 | 6/1975 | Bajorek | 360/113 |
| 4,103,315 | 6/1977 | Hempstead et al. | 360/110 |
| 4,535,375 | 1/1983 | Mowry et al. | 360/113 |

Primary Examiner—Robert S. Tupper
Attorney, Agent, or Firm—Otto Schmid, Jr.

[57] ABSTRACT

A magnetoresistive (MR) read transducer assembly in which the thin film MR layer is longitudinally biased only in the end regions by exchange bias developed by a thin film of antiferromagnetic material that is deposited in direct contact with the MR layer in the end regions. The longitudinal bias is of a level sufficient to maintain the end regions of the MR layer in a single domain state and thereby induce a single domain state in the central region of the MR layer. Transverse bias is produced within the central region of the MR layer of a level sufficient to maintain that region of the MR layer in a linear response mode. Spaced conductive elements are connected to the MR layer within the central region to define a detection region so that signal output means connected to the conductive elements can determine the resistance changes in the detection region of the MR layer as a function of the fields which are intercepted by the MR layer.

18 Claims, 6 Drawing Figures

MAGNETORESISTIVE READ TRANSDUCER HAVING PATTERNED LONGITUDINAL BIAS

BACKGROUND OF THE INVENTION

1. Field of the Invention

This invention relates in general to magnetic transducers for reading information signals from a magnetic medium and, in particular, to an improved magnetoresistive read transducer.

2. Description of the Prior Art

The prior art discloses a magnetic transducer referred to a magnetoresistive (MR) sensor or head which has been shown to be capable of reading data from a magnetic surface at great linear densities. An MR sensor detects magnetic field signals through the resistance changes of a read element made from a magneto-resistive material as a function of the amount and direction of magnetic flux being sensed by the element.

The prior art also teaches that in order for an MR element to operate optimally, two bias field should be provided. In order to bias the material so that its response to a flux field is linear a transverse bias field is generally provided. This bias field is normal to the plane of the magnetic media and parallel to the surface of the planar MR element.

The other bias field which is usually employed with MR elements is referred to in the art as the longitudinal bias field which extends parallel to the surface of the magnetic media and parallel to the lengthwise direction of the MR element. The function of the longitudinal bias field is to suppress Barkhausen noise which originates from multi-domain activities in the MR element.

Numerous prior art biasing methods and apparatus for MR sensors have been developed which use both longitudinal and transverse bias together, and these prior art biasing methods and apparatus have been effective to meet prior art requirements. However, the drive toward increased recording density has led to the requirement for narrower recording tracks and increased linear recording density along the tracks. The small MR sensors which are necessary to meet these requirements cannot be made with the use of the prior art techniques due to competing bias requirements. On the one hand, the longitudinal bias must be strong enough for domain suppression and this bias produces a field along the MR element. On the other hand, the transverse bias field is normal to the longitudinal bias field, so the longitudinal bias field competes against the transverse bias field and the transverse data signal. As a result of this bias competition, the MR sensor is chronically underbiased and signal sensitivity is significantly reduced. These high recording density applications require a very efficient output which prior art techniques are unable to produce.

Commonly assigned U.S. Pat. No. 3 887,944 discloses an integrated array of side-by-side MR reading heads. To eliminate crosstalk between adjacent MR read heads, a region of high coercivity material is formed between adjacent MR sensors. One of the ways discussed to produce the region of high coercivity material is by exchange coupling between an antiferromagnetic material and the MR sensor. However, there is no consideration of the possibility of obtaining exchange bias fields from this coupling, the direction of such bias fields, if they do exist, and the subsequent domain states of the MR sensor.

Commonly assigned U.S. Pat. No. 4,103,315 discloses the use of antiferromagnetic-ferromagne exchange coupling to produce a uniform longitudinal bias along the entire MR sensor for domain suppression.

The prior art does not disclose a MR sensor which is biased with longitudinal bias only in the end regions and transverse bias in a central active region, where actual sensing of data is accomplished.

SUMMARY OF THE INVENTION

It is therefore the principle object of this invention to provide a technique for domain suppression in an MR sensor without adversely affecting the sensor sensitivity.

In accordance with the invention, a magnetoresistive (MR) read transducer assembly comprises a thin film of MR conductive layer formed of magnetic material and means are provided to produce a longitudinal bias directly in the end regions only of the MR layer of a level sufficient to maintain the end regions of the MR layer in a single domain state. The central region of the MR layer experiences no direct field from the longitudinal bias, but, through magnetostatic and exchange coupling along the MR layer, the single domain states of the end regions induce a single domain state in the central region of the MR layer. Means are provided for producing a transverse bias in at least a part of the central region of the MR layer of a level sufficient to maintain the transverse biased part of the central region of the MR layer in a linear response mode. Conductive means are connected to the MR layer within the central region to define a detection region so that sensing means connected to the conductive means can determine the resistance changes in the detection region of the MR layer as a function of the fields which are intercepted by the MR layer.

In a specific embodiment, a thin film of antiferromagnetic material is provided in direct contact with the end regions only of the MR layer to produce the longitudinal bias in the end regions only of the MR layer of a level sufficient to maintain the end regions of the MR layer in a single domain state. A thin film of soft magnetic material is provided parallel to, but spaced from, the MR layer. A current source is connected to the conductive means to supply a bias current to the assembly to produce the transverse bias in at least a part of the central region of the MR layer of a level sufficient to maintain that part of the MR layer in a linear response mode.

The foregoing and other objects, features and advantages of the invention will be apparent from the following more particular description of a preferred embodiment of the invention as illustrated in the accompanying drawings.

The principles of operation of the magnetoresistive (MR) sensor, according to the invention, will be described with the aid of FIG. 1-3.

DESCRIPTION OF THE PREFERRED EMBODIMENTS

Figure 1:
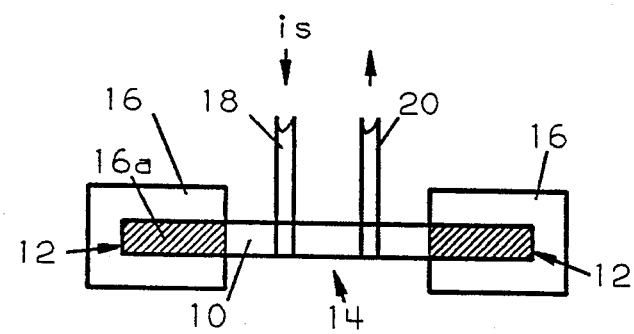
FIG. 1 is a sketch showing conceptually how the longitudinal bias is non-uniformly applied to the MR layer according to the present invention.

With reference to FIG. 1, the magnetoresistive (MR) sensor 10 according to the invention is provided with longitudinal as well as transverse bias, and the resulting bias is such as to render the sensor with optimal sensitivity and side reading characteristics. However, the bias is not uniformly applied to the MR sensor. The longitudinal bias ($H_{BL}$) for domain suppression is applied only to the end regions 12 of the MR sensor 10, and the transverse bias ($H_{TB}$) for a linear response mode is applied to at least a part of the central region 14 of the MR sensor 10.

The longitudinal bias can be produced by any suitable method known in the art for producing a longitudinal bias. In the embodiment shown in the drawings, the longitudinal bias is produced by an exchange biasing method. The exchange bias is produced by patterning an antiferromagnetic layer 16 so that it covers only the end regions 12 of the MR sensor 10, and, as a result, only the end regions 12 of the MR sensor 10 are exchange biased. The antiferromagnetic layer 16 creates an interfacial exchange interaction in the hatched areas 16a in FIG. 1 that results in an effective bias field experienced by the MR sensor 10, and this bias field is oriented longitudinally for domain suppression.

Figure 2:
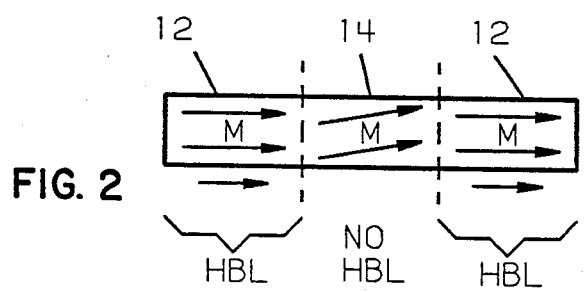
FIG. 2 is a sketch showing the aligned state of the longitudinal bias field according to the present invention.

The effects of the longitudinal biasing can be seen in FIG. 2. The end regions 12 of the MR sensor 10 are maintained in a single domain state by the longitudinal bias with the bias field oriented along the MR sensor in the same direction, to the right as shown in FIG. 2. However, the central region 14 of the MR sensor 10 experiences no direct field from the longitudinal bias, $H_{BL}$, and for this reason no significant loss of transverse sensitivity of MR sensor 10 occurs. The aligned single domain magnetic state at the end regions 12 of MR sensor 10 renders reverse domain creation in the central region 14 very unfavorable, thereby inducing a single domain state in the central region 14 of the MR sensor 10 as shown in FIG. 2.

Once the longitudinal bias, $H_{BL}$, has been produced, at least a part of the central region 14 of MR sensor 10 is provided with a transverse bias of a level sufficient to maintain that the part of central region 14 of the MR sensor 10 in a linear response mode. The transverse bias can be provided by shunt biasing, soft-film biasing, or permanent magnet biasing as is known in the art to produce a desired rotation in magnetic moment M, as shown in FIG. 3. An output signal $i_s$ can then be coupled out to a sensing means 19, with the aid of electrical conductor means 18,20 which are connected to the MR sensor 10 within the central region 14 of the MR sensor 10. The signal $i_s$ enables the sensing means to determine the resistance changes in a detection region within said central region 14 as a function of the fields which are intercepted by the MR sensor 10 from previously recorded data on a magnetic medium, for example. The distance between the inner edges of conductor means 18 and 20 comprises the detection region over which the output signal is sensed.

The simplest configuration is an unshielded MR sensor. In this case, since the signal flux from recorded magnetic transitions can enter the sensor through its entire height, linear recording density is usually low. The recording density is limited primarily by practical lower limits to the height of the sensor. To improve the linear recording density, the MR element is usually placed in the gap between two soft-magnetic shields.

It can therefore be seen that the MR sensor according to the present invention solves the problems encountered in prior art biasing methods and apparatus in a novel manner. The present invention recognizes that the MR sensor can be divided into two regions, i.e., and active region, where actual sensing of data is accomplished, and end regions. The present invention further recognizes that the two regions should be biased in different manners with longitudinal bias only in the end regions and transverse bias in the active region. The signal performance of the MR sensor which incorporates the present invention is minimally affected by variations in the level of longitudinal bias so long as the level of longitudinal bias is sufficient to maintain the end regions 14 of the MR sensor 10 in a single domain state. In direct contrast, the competing bias requirements of prior art MR sensors cause a significant effect on the signal performance of the MR sensor due to changes in the level of longitudinal bias.

The present invention is based on the premise that with the end regions in a single domain mode, the central region is forced into a single domain mode and this is true so long as the longitudinally unbiased gap ($L_{NLB}$) is not too large in comparison to the height of the MR sensor.

Figure 3:
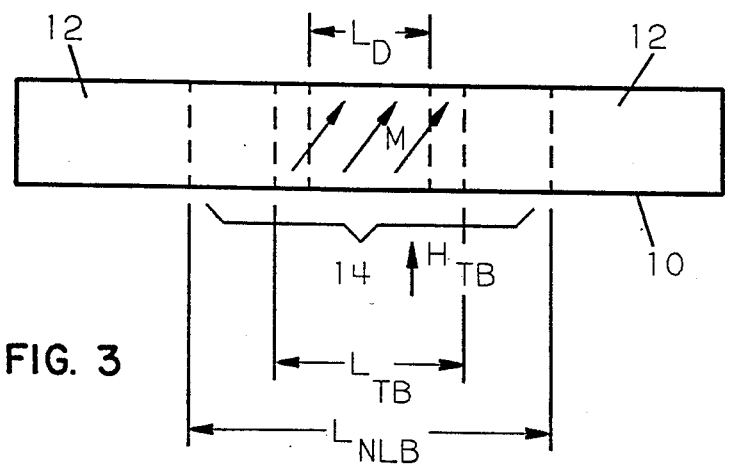
FIG. 3 is a sketch showing the relationship of various regions of the MR layer according to the present invention.

The relationship between the longitudinally unbiased length, $L_{NLB}$, the transverse biased length, $L_{TB}$, and the length of the detection region, $L_D$, is shown in FIG. 3. The relationship between these lengths is such that $$L_{NLB} \geqq L_{TB} \geqq L_D$$

is generally true. Also $$L_{TB} \geqq L_D \text{ and } L_{NTB} \geqq L_D$$

holds true.

While it is true that generally there is no overlap of $L_{NLB}$ and $L_{TB}$, some overlap is permissible so long as the above conditions relative to $L_D$ are met.

When the additional constraint of side reading suppression is considered, it is clear that $L_{TB}$ should not be greater than $L_D$ since $L_D$ is normally chosen substantially equal to the recording track width and the existence of an area of transverse biased sensor outside the detection region $L_D$ would result in increased side reading from adjacent tracks. Also it is clear that $L_{NLB}$ should not be greater than $L_D$ since the end regions, due to the strong longitudinal bias, are made insensitive to signals from neighboring tracks. As a result, side-reading would be suppressed. These considerations lead to the conclusion that $L_{NLB} = L_{TB} = L_D$ is the optimum arrangement for maximum sensitivity and also greatest side reading suppression.

Figure 4:
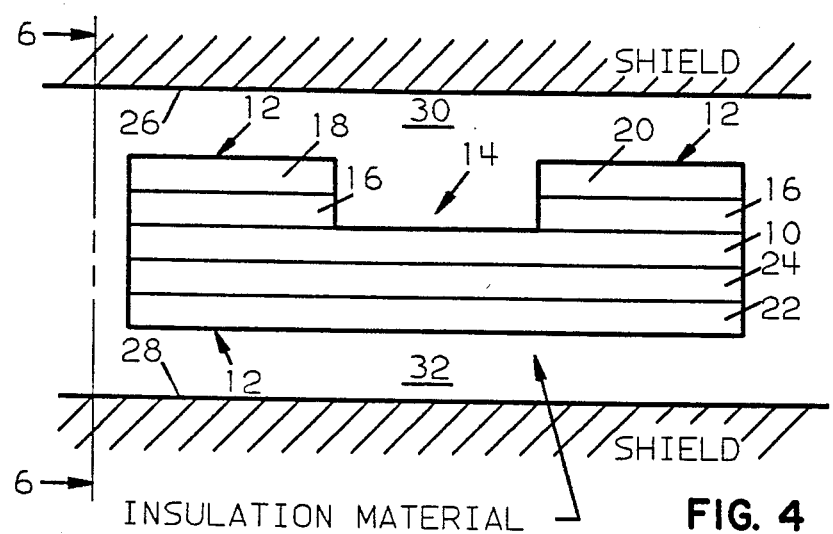
FIG. 4 is an end view of a specific embodiment of a MR read transducer assembly embodying the invention.
Figure 5:
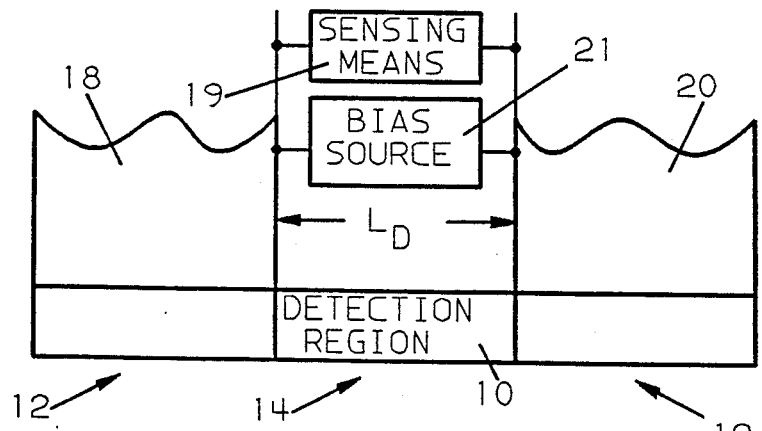
FIG. 5 is plan view of the transducer shown in FIG. 4.
Figure 6:
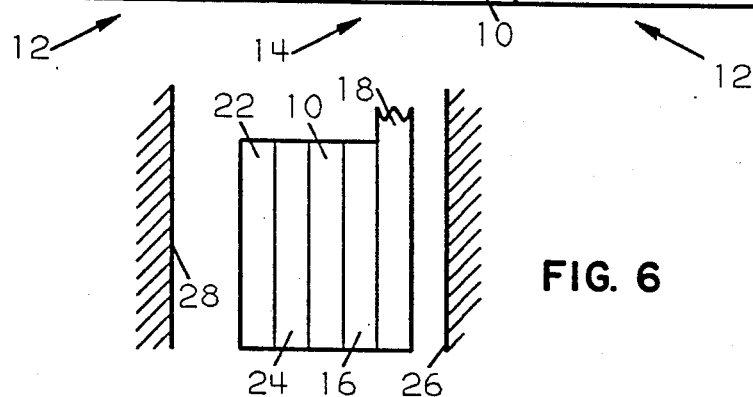
FIG. 6 is a section view taken along lines 6—6 of FIG. 4.

A specific embodiment of a MR read transducer assembly encorporating the invention is shown in FIGS. 4, 5 and 6. Referring to FIG. 4 there is shown a MR thin film layer 10 intimately electrically in contact with an antiferromagnetic thin film layer 16. The thin film layers 10 and 16 produce exchange bias in the covered area of the MR 10 so that the MR layer 10 is longitudinally biased in a single domain mode in the end regions 12. On the opposite side of MR layer 10, a means for producing a transverse bias field comprising a soft magnetic film layer 22 is provided, and layer 22 is separated from the MR layer 10 by a thin spacer layer 24. The purpose of layer 22 is to provide a soft film transverse bias of the central region 14 of the MR layer 10. Magnetic shields 26 and 28 are provided to minimize the effects of stray magnetic flux which would decrease the resolution of the readback signal, and electrical insulating layers 30 and 32 are provided to isolate these shields from the active components of the transducer assembly.

The choice of materials for the MR layer 10 and the antiferromagnetic layer 16 in FIG. 4 is a significant consideration. For the MR layer 10, a soft magnetic material is desired which has low magnetostriction and a reasonably high MR coefficient. In general, a very thin film would be desirable since thinner films are more sensitive. However, as a practical matter, the thickness of the film must be chosen to avoid very thin films whose thickness and properties are hard to control. The MR layer 10 may be formed reliably which has a thickness in the range of approximately 200 to 500 Angstroms. In a specific embodiment, Permalloy NiFe alloy was chosen for the specific requirements in that application.

The choice of a material for layer 16 requires a material that is antiferromagnetic not only when deposited over the material chosen for the MR layer but also when deposited in a thin film form. In addition the material should have a Neel temperature substantially higher than the operating temperature of the read transducer. The antiferromagnetic layer 16 is deposited to produce a unidirectional bias along the length of the assembly. Alternatively, the direction of the unidirectional bias field can be set by heating the MR-antiferromagnetic material layer above the ordering temperature, and then cooling the layer in an externally applied unidirectional magnetic field. The thickness of the material should be thick enough for reliable fabrication with a minimum thickness of about 100 Angstroms, and ranging up to several hundred Angstroms. In a specific embodiment MnFe was chosen for the specific requirements in that application.

An important consideration in the soft-film biasing is the selection of a desirable soft film material such as layer 22 in FIG. 4. The material must exhibit high permeability, high resistivity, and no appreciable MR effect of its own. The high permeability ensures adequate biasing from bias source 21 with modest bias currents, the high resistivity is desirable to minimize electrical shunting of signal, and the low MR coefficient compared with that of the MR layer 10 is needed to avoid cancellation of biasing and signal responses. The thickness of the soft-film biasing layer 22, usually in a range of 100 to 500 Angstroms, is chosen so that it will saturate. The characteristics of the material being used for the MR layer 10 must also be considered so that the ratio of thicknesses of the MR layer 10 and the soft film bias layer 22 can be chosen to produce the transverse bias to bias the central region 14 of MR layer 10 to the chosen angle. In a specific embodiment, NiFeRh was chosen for layer 22 for the specific requirements in that application.

The purpose of spacer layer 24 is to provide physical spacing between the MR layer 10 and soft film bias layer 22, since separation is necessary for these layers to produce opposite magnetization rotations. Spacer layer 24 should have high resistivity, should not diffuse into either of the layers 10 and 22, and should have the property of being easily deposited in thin layers. The thickness of the layer 24 should be as thin as can be reliably fabricated such as 200 Angstroms, for example. In a specific embodiment, Ta was chosen for this layer, but other materials such as $Al_2O_3$ or $SiO_2$ could also be used.

The method for making the magnetoresistive read transducer is not a part of the present invention. It will be recognized by those skilled in the art that the transducer can be made by any of the known thin film manufacturing processes in a manner similar to making integrated circuit chips. These manufacturing processes include the deposition of the thin film layers on a substrate, and appropriate shaping of the layers by suitable techniques such as selective etching and photolithographic techniques.

While the invention has been particularly shown and described with reference to a preferred embodiment thereof, it will be understood by those skilled in the art that various other changes in the form and details may be made therein without departing from the spirit and scope of the invention.

Having thus described my invention, what I claim as new, and desire to secure by Letters Patent is:

1. A magnetoresistive read transducer assembly comprising:
   a thin film of magnetoresistive conductive layer formed of magnetic material, said magnetoresistive conductive layer having end regions separated by a central region;
   means for producing a longitudinal bias directly in said end regions only of said magnetoresistive layer of a level sufficient to maintain said end regions of said magnetoresistive layer in a single domain state, said single domain states of said end regions thereby inducing a single domain state in said central region;
   means for producing a transverse bias in at least a part of said central region of said magnetoresistive layer of a level sufficient to maintain said transverse biased part of said magnetoresistive layer in a linear response mode; and
   conductive means connected to said magnetoresistive layer within said central region to define a detection region whereby sensing means connected to said conductive means can determine the resistance changes in the detection region of said magnetoresistive layer as a function of the fields which are intercepted by said layer.

2. The magnetoresistive read transducer assembly of claim 1 wherein said magnetoresistive layer is NiFe.

3. The magnetoresistive read transducer assembly of claim 2 wherein said magnetoresistive layer has a thickness in the range of 200–5,00 Angstroms.

4. The magnetoresistive read transducer of claim 1 further comprising:
   a thin film of antiferromagnetic material in direct contact with said end regions only of said magnetoresistive layer to produce said longitudinal bias directly in said end regions only by exchange biasing.

5. The magnetoresistive read transducer assembly of claim 4 wherein said thin film of antiferromagnetic material is MnFe.

6. The magnetoresistive read transducer assembly of claim 5 wherein said thin film of antiferromagnetic material has a thickness in the range of 100-500 Angstroms.

7. The magnetoresistive read transducer assembly of claim 1 wherein said conductive means comprises spaced conductive elements, and said detection region is defined by the inner edges of said conductive elements.

8. The magnetoresistive read transducer assembly of claim 1 wherein the region of said magnetoresistive layer which is not longitudinally biased, said detection region, and said at least a part of said central region in which a transverse bias is produced, are substantially equal.

9. A magnetoresistive read transducer assembly comprising:
   an elongated thin film of magnetoresistive conductive layer formed of magnetic material, said magnetoresistive conductive layer having end regions separated by a central region;
   a thin film of antiferromagnetic material in direct contact with said end regions only of said magnetoresistive layer to produce a longitudinal bias in said end regions only by exchange biasing of a level sufficient to maintain said end regions of said magnetoresistive layer in a single domain state, said single domain states of said end regions thereby inducing a single domain state in said central region;
   a thin film of soft magnetic material parallel to but spaced from said magnetoresistive layer;
   conductive means connected to said magnetoresistive layer within said central region; and
   means for supplying a bias current to said conductive means to magnetically bias said magnetoresistive layer with transverse bias of a level sufficient to maintain said magnetoresistive layer in a high sensitivity condition whereby signal sensing means connected to said conductive means can determine the resistance changes in said magnetoresistive layer as a function of the fields which are intercepted by said layer.

10. The magnetoresistive read transducer assembly of claim 9 wherein said magnetoresistive layer is NiFe.

11. The magnetoresistive read transducer assembly of claim 10 wherein said magnetoresistive layer has a thickness in the range of 200-500 Angstroms.

12. The magnetoresistive read transducer assembly of claim 9 wherein said thin film of antiferromagnetic material is MnFe.

13. The magnetoresistive read transducer assembly of claim 12 wherein said thin film of antiferromagnetic material has a thickness in the range of 100-500 Angstroms.

14. The magnetoresistive read transducer assembly of claim 9 wherein said thin film of soft magnetic material is NiFeRh.

15. The magnetoresistive read transducer assembly of claim 14 wherein said thin film of soft magnetic material is thinner than said magnetoresistive layer.

16. The magnetoresistive read transducer assembly of claim 9 wherein said conductive means comprises spaced conductive elements, and said detection region is defined by the inner edges of said conductive elements.

17. The magnetoresistive read transducer assembly of claim 9 wherein the region of said magnetoresistive layer which is not longitudinally biased, said detection region, and said at least a part of said central region in which a transverse bias is produced, are substantially equal.

18. The magnetoresistive read transducer assembly of claim 9 further comprising magnetic shields disposed about said transducer assembly.

* * * * *